(12) United States Patent
LaFontaine et al.

(10) Patent No.: US 7,714,406 B2
(45) Date of Patent: May 11, 2010

(54) LOW-COST ELECTROSTATIC CLAMP WITH FAST DE-CLAMP TIME

(75) Inventors: Marvin Raymond LaFontaine, Kingston, NH (US); Michael Pharand, Chelmsford, MA (US); Leonard Michael Rubin, S. Hamilton, MA (US); Klaus Becker, Kensington, NH (US)

(73) Assignee: Axcelis Technologies, Inc., Beverly, MA (US)

( * ) Notice: Subject to any disclaimer, the term of this patent is extended or adjusted under 35 U.S.C. 154(b) by 267 days.

(21) Appl. No.: 11/924,166

(22) Filed: Oct. 25, 2007

(65) Prior Publication Data
US 2008/0100984 A1  May 1, 2008

Related U.S. Application Data

(60) Provisional application No. 60/854,143, filed on Oct. 25, 2006.

(51) Int. Cl.
*H01L 27/10* (2006.01)
(52) U.S. Cl. .............. 257/499; 257/786; 257/E27.073; 361/234
(58) Field of Classification Search .................. 361/234
See application file for complete search history.

(56) References Cited

U.S. PATENT DOCUMENTS

| | | | |
|---|---|---|---|
| 4,384,918 A * | 5/1983 | Abe ........................... 216/71 |
| 4,724,510 A | 2/1988 | Wicker et al. |
| 4,999,507 A | 3/1991 | Clemens et al. |
| 5,572,398 A | 11/1996 | Federlin et al. |
| 6,088,213 A * | 7/2000 | Herchen ..................... 361/234 |
| 6,552,892 B2 | 4/2003 | Carroll et al. |
| 6,921,724 B2 | 7/2005 | Kamp et al. |
| 6,946,403 B2 | 9/2005 | Kellerman et al. |
| 7,072,166 B2 | 7/2006 | Qin et al. |
| 7,142,406 B2 * | 11/2006 | Kwon ......................... 361/234 |
| 2005/0286202 A1 * | 12/2005 | Nakamura ................... 361/234 |
| 2006/0226485 A1 * | 10/2006 | Arakawa ..................... 257/347 |
| 2009/0135540 A1 * | 5/2009 | Poh ............................ 361/234 |

* cited by examiner

*Primary Examiner*—Stephen W Smoot
(74) *Attorney, Agent, or Firm*—Eschweiler & Associates, LLC

(57) ABSTRACT

A method for manufacturing a semiconductor wafer electrostatic clamp, comprising providing a mounting plate, forming an insulative layer on an insulating portion of the mounting plate, forming a first electrode on a first portion of the mounting plate, forming a second electrode on a second portion of the mounting plate, forming a first segment having a first conductivity over the first electrode, forming a first region having a second conductivity over the first segment that creates an n-p type composite, forming a second segment having a third conductivity formed over the over the second electrode, forming a second region having a fourth conductivity formed over the second region that creates an p-n type composite.

13 Claims, 8 Drawing Sheets

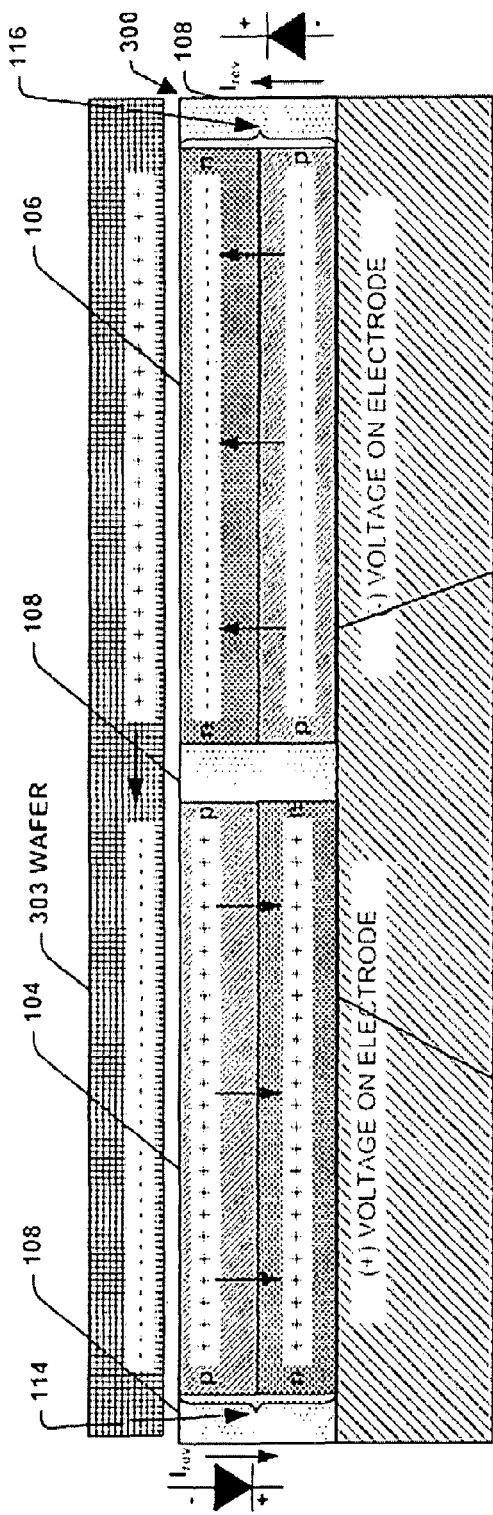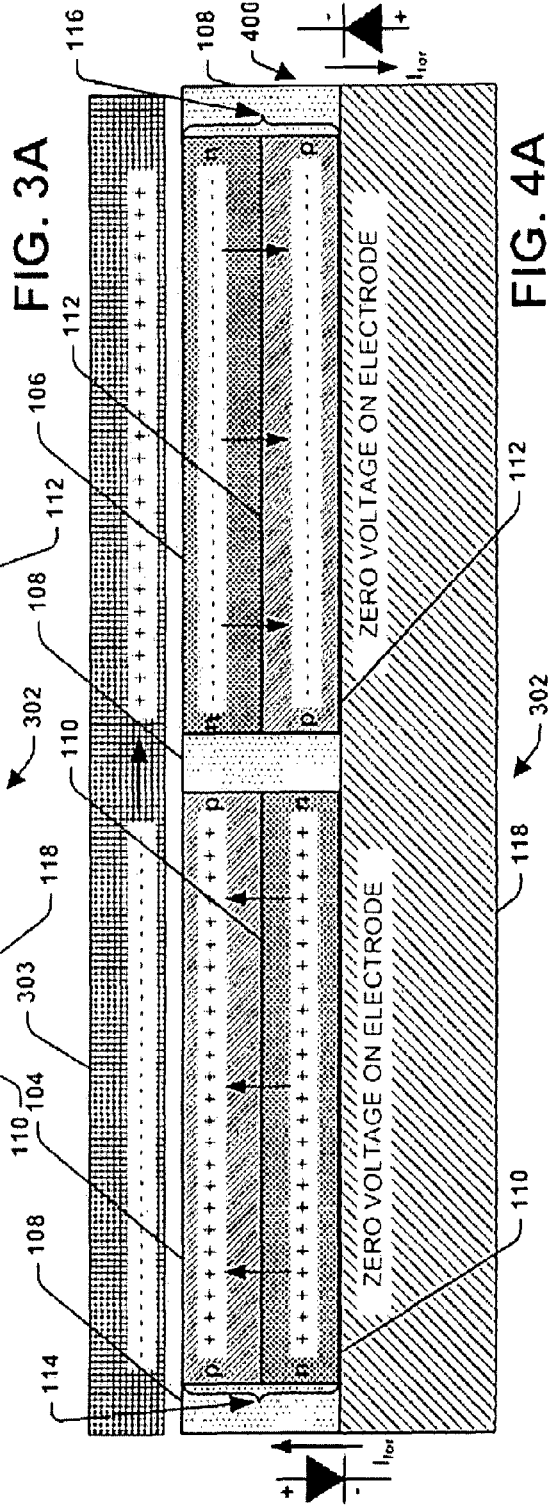

CLAMP VOLTAGE-CURRENT CHARACTERISTICS
OF THE LEFT SIDE OF FIG. 3A

CLAMP VOLTAGE-CURRENT CHARACTERISTICS
OF THE RIGHT SIDE OF FIG. 3

LOW-COST ELECTROSTATIC CLAMP WITH FAST DE-CLAMP TIME

REFERENCE TO RELATED APPLICATION

This application claims priority to and the benefit of U.S. Provisional Application Ser. No. 60/854,143 which was filed Oct. 25, 2006, entitled LOW-COST ELECTROSTATIC CLAMP WITH FAST DE-CLAMP TIME, the entirety of which is hereby incorporated by reference as if fully set forth herein.

FIELD OF THE INVENTION

The present invention relates generally to semiconductor electrostatic clamping systems and methods, and more specifically to a system and method for clamping a wafer/workpiece to an electrostatic chuck that utilizes "n" and/or "p" wafer segments, taken from a wafer(s), tuned to achieve specific and/or desired bulk resistivities.

BACKGROUND OF THE INVENTION

Electrostatic chucks (ESCs) have been utilized in plasma-based or vacuum-based semiconductor processes such as etching, CVD, ion implantation, and the like. A typical ESC, for example, comprises a dielectric layer positioned over a conductive electrode, wherein the semiconductor wafer is placed on a surface of the ESC (e.g., the wafer is placed on a surface of the dielectric layer). During semiconductor processing (e.g., plasma processing), a clamping voltage is typically applied between the wafer and the electrode, wherein the wafer/workpiece is clamped against the clamp or chuck surface by electrostatic forces.

With the need for ever-increasing throughput and uniformity of semiconductor wafers, it is critical that the wafer be held firmly to the electrostatic clamp during processing. During a given process the wafer can experience up to 50 g forces and yet, it is critical to maintain wafer uniformity throughout the process and to un-clamp the wafer quickly once the processing is complete. Johnson-Rahbek (JR) clamps are routinely used in processing semiconductor wafers because of their ability to apply a large force to the wafer. In addition, it is critical that the wafer not slide on the clamp, as the clamping system would lose its frame of reference or index, and the backside of the wafer would suffer excessive particle contamination. JR clamps can apply a force to the wafer that is much larger than a Coulombic clamp, for example, however, the JR clamps take much longer to de-clamp, typically 10 seconds or greater. De-clamping or "un-sticking" the wafer from the chuck surface is a concern in many ESC applications. For example, after the electrostatic clamping voltage is turned off, the wafer cannot be removed by typical wafer lifting mechanisms (e.g., pins extending through the ESC which are operable to lift the wafer from the surface of the dielectric layer, edge grippers which are operable to lift the wafer, and the like). This wafer de-clamping problem can reduce the throughput of the wafer manufacturing process. It is believed that the current wafer de-clamping problem occurs when residual charges induced by the clamping voltage remain on the dielectric layer or on a surface of the wafer, therein leading to undesirable residual electric fields and clamping forces. According to a charge migration model, residual charges are caused by charge migration and accumulation during clamping, wherein the charges accumulate at the dielectric surface and/or wafer backside (e.g., when the wafer surface comprises an insulating layer). The clamp or wafer, by its very nature, is constructed of dielectric or semiconductor material that naturally inhibits the flow of charge.

As an extreme example, an RC time constant, can be used to characterize the charge/discharge times which correspond to the amount of time typically required to respectively clamp or de-clamp the wafer. This time constant is determined by the product of a volume resistance of the dielectric layer and a gap capacitance between the wafer and dielectric surfaces, i.e., $$RC = R_{die}C_{gap} = \rho(\text{dielectric})\varepsilon_0\varepsilon_r\frac{d(\text{dielectric})}{\text{gap}} \qquad (1)$$

where $R_{die}$ is the resistance of the dielectric layer, $C_{gap}$ is the capacitance of the gap between the wafer and the chuck surface, $\rho$ (dielectric) is the volume resistivity of the dielectric layer, $\varepsilon_0$ is the free space permittivity, $\varepsilon_r$ is the dielectric constant of the gap, d(dielectric) is the thickness of the dielectric layer, and gap is the distance between the dielectric and wafer surfaces. For example, for a typical flat-plate ESC, if we assume that $\rho(\text{dielectric})=10^{15}$ $\Omega$–cm, $\varepsilon_0=8.85\times10^{-14}$ F/cm, $\varepsilon_r=1$, d(dielectric)=0.2 mm, and gap=3 μm, we find RC=5900 seconds. This is a fairly long charging/discharging time, meaning that if clamping is longer than 5900 seconds, the de-clamping time will also last approximately 5900 seconds.

FIG. 1 is a schematic illustration of a side view of a prior art Johnson-Rahbek (JR) clamp 22 that is currently used in industry. The JR clamp 22, as shown consists of a dielectric 10, an electrode 12, and a voltage source 14. By applying a positive voltage to the electrode 12, the voltage source 14 charges the electrode 12, to a positive state, as shown in FIG. 1. The dielectric 10 becomes charged as indicated by the positive charges 16 at the upper surface. In this type of JR clamp 22, the upper surface of the dielectric 10 is typically doped in order to make it more conductive, therefore a semiconductor. The smaller the gap, "g", 18, the greater the electrostatic force between the wafer 20 and the electrostatic clamp 22. The electrostatic force is a function $(1/g^2)$ and therefore as the gap decreases, the force increases substantially.

One reason that the JR clamp 22 is difficult to separate from the wafer 20 is that the charge 16 at the top surface of the dielectric 10 has to drain out of the upper surface before it can release the wafer 20. In a Coulombic clamp (not shown), the wafer releases much faster because the charges are stored differently than they are in a JR clamp 22. However, a Coulombic clamp does not exert the strong forces like the JR clamp 22.

A variety of techniques have been previously disclosed for reducing wafer de-clamping problems encountered in the use of ESCs. For example, one conventional technique involves applying a reversal voltage before the wafer is removed from the ESC, therein eliminating a residual attractive force. This reversal voltage, however, is typically 1.5 to 2 times higher than the clamping voltage, and the de-clamping time is still typically quite large. Another conventional technique involves providing a low-frequency sinusoidal AC voltage in order to produce sine wave fields of controlled amplitude and phase in the clamp. Such low-frequency sinusoidal AC voltages, however, typically provide low clamping forces, as well as fairly long residual clamping times.

In addition, the cost of manufacturing an ESC tends to be very high. This is due in large part to the difficult manufacturing process involved in building an ESC. First, the chucking surface must be extremely flat, typically better than 15 μm, in order to reduce backside gas leakage, to increase thermal contact between the wafer and the ESC, and the like. Second, the dielectric material above the electrodes must be thin, about 150 μm to 1000 μm, in order to increase the clamping force exerted on the wafer, but also the material thickness must be very uniform, without pinholes, defects, etc., that can result in arcing between the wafer/workpiece and the electrode. Third, the dielectric material must be of extremely high purity, where the levels of contaminates do not exceed parts per million in composition, for example. Additionally, in the case of a JR type ESC, where the dielectric material is doped, for example, to make the ESC semiconductive, the dopant must be uniformly distributed throughout the material.

Therefore, a need exists in the art for a wafer/workpiece clamping/de-clamping system and method which is improved over the current art, as well as reducing the manufacturing cost and the overall cost of the electrostatic clamp.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

Challenges of the prior art are overcome in the present invention by utilizing relatively inexpensive crystalline wafers in the manufacture of the electrostatic clamp. This represents substantial cost savings over existing manufacturing methods for electrostatic clamps. The invention exploits the well-known non-linear current transfer properties of a p-n diode to greatly reduce wafer de-clamping time. Starting with a 'p' type wafer or an 'n' type wafer, the wafer is doped in such a way that when the underlying electrode is energized with an applied voltage, for example, 800 V, the charge moves from the electrode up to the top surface of the "wafer material clamp". With the charge at the upper surface of the wafer material clamp, it acts similar to current electrostatic clamps.

The present invention utilizes a relatively simple and inexpensive apparatus made of wafer material in comparison with various costly conventional electrostatic chucks. The invention takes advantage of the economies of scale that exist with commercially available semiconductor wafers, as well as the standardized precision and the material properties of wafers. The n- and p-layers can be tuned to achieve the desired current-voltage characteristics, for example, to improve the performance of the electrostatic clamp. The flatness of the dielectric is substantially similar to the flatness of the wafer, which is governed by SEMI standards and is extremely precise. Additionally, the thickness of the dielectric layer is extremely uniform, since it is governed by SEMI standards, as is the flatness for the wafer of the ESC. Lastly, the dielectric layer is of extremely high purity since it is also governed by the same standards mentioned above.

According to yet another aspect of the present invention, when the electrostatic clamp is turned off, the p-n device is forward biased so that it discharges into the electrode very quickly. The discharge will take place on the order of 10 ms-100 ms. Another aspect of this invention is that the non-linear current-voltage characteristics of a p-n diode are exploited so that the clamp can hold the wafer firmly but be discharged rapidly after wafer processing is complete According to another aspect of the present invention, the p-n junctions can be tuned to achieve the desired current-voltage characteristics necessary for creating the desired electrostatic clamp. A bulk resistivity that is typically "seen" by the charge from the electrode to the outer clamping surface is on the order of about $10^9$-$10^{10}$ Ω-cm. This is a typical resistivity which is typically used, for example, in a JR type electrostatic clamp to efficiently allow the charge to migrate from the electrode to the surface of the ESC.

Furthermore, according to another exemplary aspect of the invention, the wafer can almost instantaneously (e.g., less than 100 ms) be de-clamped after the clamping voltage is turned off, due at least in part to the doped properties of the electrostatic clamp materials (i.e., wafer materials).

According to another aspect of the present invention, the electrostatic clamp can be built utilizing p-type wafers and n-type wafers combined with photolithographic processes to form the electrostatic clamp. In that way, the electrostatic clamp can take advantage of the superior properties, characteristics, etc., of the p-n junctions.

According to yet another exemplary aspect of the invention, the electrostatic clamp can be much less costly than current clamps. The wafers are readily available, of very high precision and relatively low cost for the current invention. In contrast, it is not uncommon for current electrostatic clamps to cost $35,000 or more. This is because of the flatness requirements, the necessary bulk resistivity of the ESC, the purity of the materials needed for the clamping, and the like. Whereas, a wafer utilized in manufacturing the clamp has a cost of approximately $300 or less and it exhibits the necessary flatness, thickness, material properties, etc., to work in an electrostatic clamp. Therefore, an electrostatic clamp utilizing silicon wafers can cost approximately $5,000 or less, which is equivalent to approximately an 85% reduction in cost, and yet have superior properties to existing clamps. In addition, the surface finish of a polished wafer is typically less than 1 nanometer (nm). This is much better than the surface finish of existing electrostatic clamps, typically 10 μm-50 μm. In addition, it can take over four months to build a conventional ESC. According to another exemplary aspect of the invention, there is a reduced production time for building the electrostatic clamps.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 3A is a cross-sectional side view of an exemplary electrostatic clamp, according to yet another aspect of the present invention;

FIG. 4A is a cross-sectional side view of an exemplary electrostatic clamp, according to yet another aspect of the present invention;

DETAILED DESCRIPTION OF THE INVENTION

Figure 1:
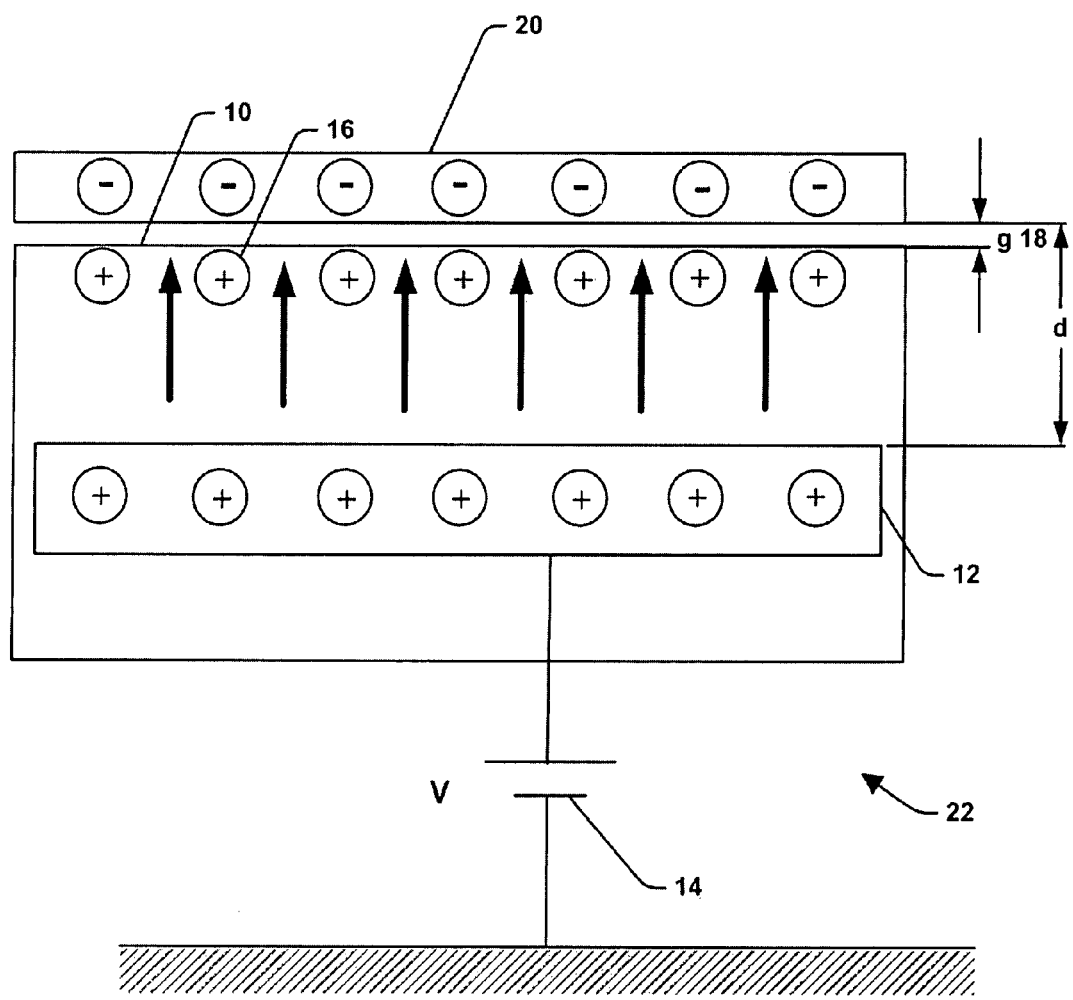
FIG. 1 is a side view of an exemplary prior art electrostatic clamp according to an aspect of the present invention.

The present invention is directed towards a system and a method for clamping and de-clamping a wafer utilizing an electrostatic clamp (ESC) manufactured utilizing existing wafers. Accordingly, the present invention will now be described with reference to the drawings, wherein like reference numerals are used to refer to like elements throughout. It should be understood that the description of these aspects are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details.

The present invention overcomes challenges of the prior art by providing a low cost and high precision system and method for clamping and de-clamping a wafer (e.g., a semiconductor substrate) and manufacturing an electrostatic clamp.

Figure 2A:
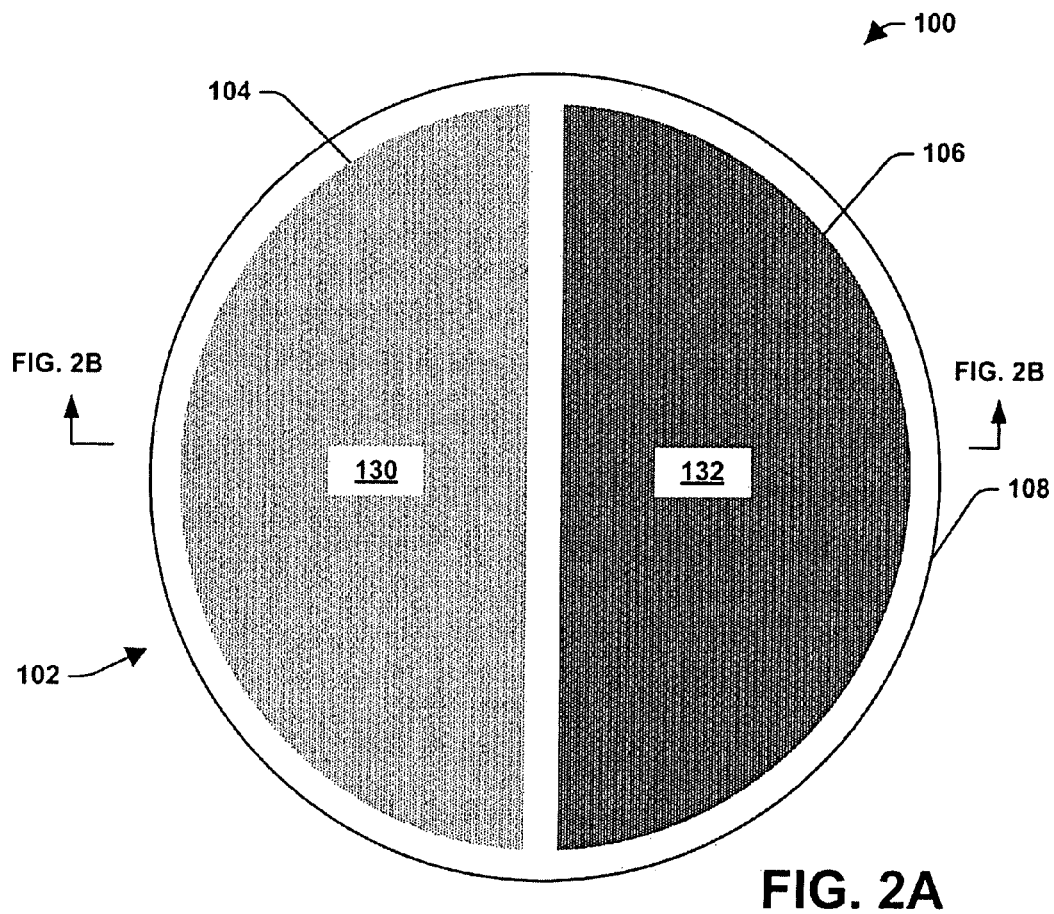
FIG. 2A is a top view illustrating an exemplary bi-polar electrostatic clamp, according to another aspect of the present invention.

Referring now to the drawings, FIG. 2A illustrates a top view of an ECS 102 according to an aspect of the current invention, wherein the clamping system 100 comprises the electrostatic clamp 102 for selectively clamping a wafer (not shown) thereto. According to the invention, the top surface of the electrostatic clamp 102 comprises a first p-type region 104, a second n-type region 106 and an insulative ceramic layer 108. The formed insulative ceramic layer 108 is shown as the outer edge of the electrostatic clamp 102, as well as the region separating the p-type region and n-type region, 104 and 106, respectively. A voltage source, for example, can be operable to selectively provide a voltage potential to the electrodes (not shown) of the electrostatic clamp 102, wherein the voltage potential is operable to selectively electrostatically clamp and de-clamp the wafer to and from the surface of the first and second regions, 104 and 106, respectively.

The first p-type region 104 and the second n-type region 106 employed as part of the clamping system 100, offer added benefits to the current clamping systems available today. The wafers are typically made, according to the Semiconductor Equipment and Materials Institute (SEMI) international standards. SEMI is a global industrial association dedicated to creating standards, specifications, and the like, for semiconductor wafers. By utilizing SEMI standard wafers, in the electrostatic clamp, this ensures that the clamp 102 will have a specified flatness, a specified thickness, a diameter that matches the wafer being handled, specified material properties, surface finish, and the like. All of these wafers will be within a given, specified tolerance. In addition, because of the volumes of wafers made annually, the wafers are obtained at a much lower cost, when compared to the manufacturing cost of the current electrostatic clamps. Not only can the electrostatic clamp 102 be manufactured at a lower cost, the flatness, thickness, diameter, material, properties, surface finish, etc., will most likely be better than current clamps.

Figure 2B:
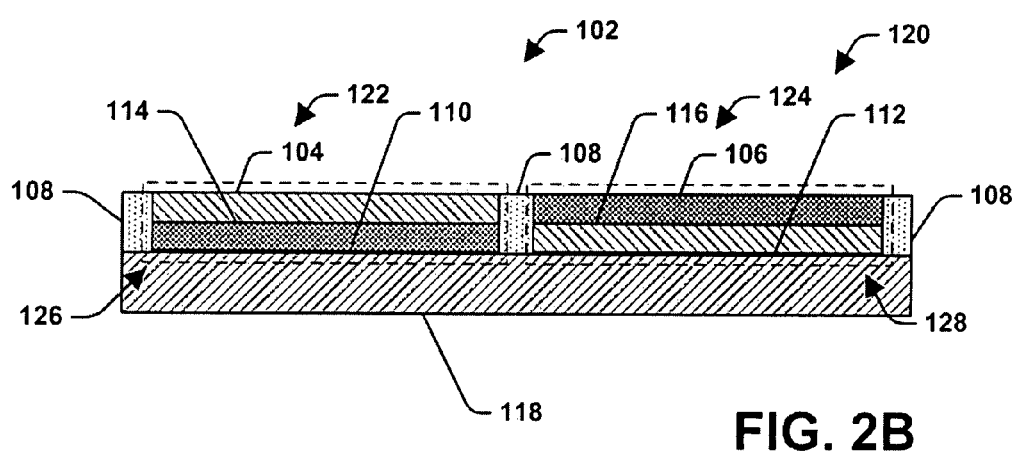
FIG. 2B illustrates an exemplary cross-section of the electrostatic clamp shown in FIG. 2A according to still another aspect of the present invention.

FIG. 2B illustrates an exemplary cross-sectional side view of a clamping system 120 illustrating the electrostatic clamp 102, shown in FIG. 2A. The exemplary electrostatic clamp 102 comprises the first p-type region 104, a p-type wafer segment 116, an n-type wafer segment 114, the second n-type region 106, the insulative layer 108, first and second electrodes 110 and 112, and a flat ceramic mounting plate 118, for example. The first and second electrodes 110 and 112 are formed on a first portion 122 and second portion 124 of the mounting plate 118, as illustrated. The first and second portions (122 and 124) can have the same shape as the first and second regions (104 and 106). The p-type first region 104 and the n-type second region 106 can be formed either by ion implantation into a wafer segment followed by annealing, or by epitaxial deposition of a silicon layer doped to the opposite conductivity type as the substrate wafer segments 114 and 116. In order to produce p-n diodes, with suitably high breakdown voltages, under reverse biasing, the doping in both the p- and n-regions can be relatively light, and the regions can be several microns thick. The two, doped wafer segments, 114 and 116, are separated, as illustrated by the insulative layer 108. The n-type wafer segment 114 and the p-type wafer segment 116 both are in contact with the electrodes 110 and 112, respectively. The electrodes 110 and 112 can be deposited on the flat ceramic mounting plate 118 in the first portion 122 and the second portion 124, respectively of the mounting plate 118, utilizing CVD processes, PVD processes, and the like. An n-p diode 126 is created by forming or inserting the wafer segment 114 having a first conductivity over the first electrode 110 and subsequently forming the first region 104 having a second conductivity over/in the first n-type wafer segment 114. A p-n diode 128 can be created by forming and/or inserting a wafer segment 116 having a third conductivity formed over the second electrode 112 and forming the second n-type region 106 having a fourth conductivity over/in the second p-type wafer segment 116.

It should be appreciated by one of ordinary skill in the art that the clamp can be built utilizing p-type wafers/wafer segments and n-type wafers/wafer segments, combined with photolithographic techniques well known by one of ordinary skill in the art.

According to another exemplary aspect of the invention, an electrostatic clamp system 300 is illustrated in accordance with the present invention, in FIG. 3A. FIG. 3A illustrates a cross-sectional side view of an exemplary electrostatic clamp 302 and a wafer 303, wherein the upper surface of the electrostatic clamp 302 comprises a first p-type region 104, a second n-type region 106, a lower n-type wafer segment 114, a lower p-type wafer segment 116, an insulative layer 108, first and second electrodes 110 and 112, respectfully, and a flat mounting plate 118. The mounting plate 118 can comprise a ceramic, a dielectric, a glass filled epoxy, and the like. The p-type region 104, for example, is formed in/on the upper first portion 122 of the n-type wafer segment 114 and the n-type region 106 is formed in/on the upper-second portion of the p-type wafer segment 116. The two doped wafer segments 114 and 116 together with the insulative layer 108 form a large diode which is operable to generally maintain a consistently strong electrostatic force with the wafer 303.

Figure 3B:
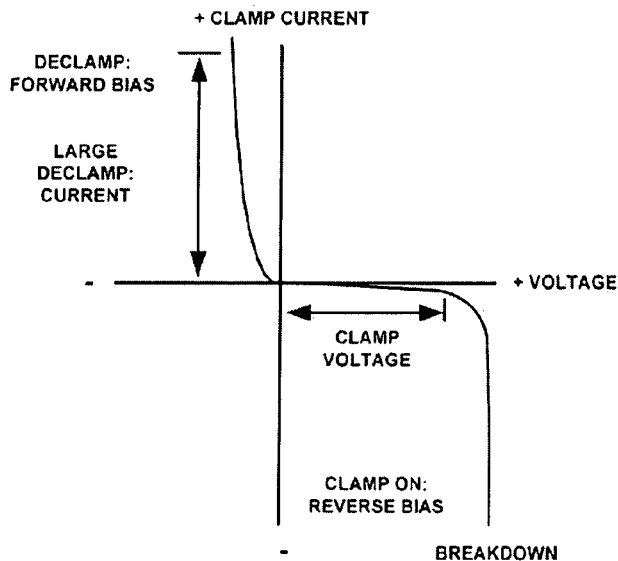
FIG. 3B is a graph of clamp voltage-current characteristics of the left side of the exemplary electrostatic clamp in FIG. 3A, according to yet another aspect of the present invention.

Referring now to FIGS. 3A, 3B, 3C, 4A, 4B and 4C, according to another exemplary aspect of the present invention, the n-type wafer segment 114 and the p-type wafer segment 116 are doped to form the p-type region 104 and the n-type region 106, respectively, so that the current-voltage characteristics of the diode result in a leakage current density of about 85 mA/m$^2$ when the electrode voltage is about 800 V, similar to a typical JR ESC. FIG. 3A shows the entire ESC 302 in the "on" configuration where it clamps/holds a wafer 303. With the dopant, the net resistivity of the wafer segments looking from the electrodes (i.e., 110 and 112) upward toward the wafer 303 is such that the voltage characteristics of the diode result in a leakage current density of about ±85 mA/m$^2$ when the electrode voltage is about ±800 V. The charge on the right side of the clamp 302, at the top of the clamp 302, is positive as indicated by the plus signs in FIG. 3A and the wafer 303 in that area is indicated as negative. The charge on the left side of the clamp 302 in FIG. 3A, at the top of the clamp 303, is negative as indicated by the minus signs and the wafer 303 in that area is shown as positive. Under these conditions the electrostatic clamp 302 is holding the wafer 303 in place and the electrons are flowing in a clockwise direction as shown by the arrows from electrode 110 through the wafer 303 and to the electrode 112. The left side of FIG. 3A illustrates the p-n side of the clamp 302 in the "on" configuration, wherein the reverse-bias leakage current moves electrons towards the 'p' region, as indicated by the arrows pointing upward, thereby causing the 'p' region to become negatively charged. The right side of FIG. 3A shows the n-p side of the clamp 302 in the "on" configuration, wherein the reverse-bias leakage current moves electrons away from the 'n' region, as indicated by the arrows pointing downward, thereby causing the 'n' region to become positively charged, as shown in FIG. 3A. The current density of the positive charge from the electrode 110 on the left side to the top of the clamp 302 is about 85 mA/m$^2$ when the first electrode 110 voltage is about 800V. The current density of the negative charge from the second electrode 112 on the right side of the clamp 302 to the top of the clamp 302 is about 85 mA/m$^2$ when the electrode 112 voltage is about −800V; however it should be appreciated by one of ordinary skill in the art that the current-voltage characteristics can be "tuned" to any desired level of electrical characteristics.

FIG. 4A shows the ESC 302 in the "off" configuration where the wafer 303 is de-clamped from the ESC 302 for subsequent removal. When both electrodes 310 and 312 have a zero voltage applied to them, the charge in the material above theme will move towards the grounded electrode (i.e., 110 and 112). The left side of FIG. 4A illustrates the p-n side of the clamp in the "de-clamp" configuration, wherein the larger forward-bias current moves electrons away from the 'p' region, thereby causing the 'p' region, as indicated by the arrows pointing downward, to become less and less positively charged and ultimately grounded. The right side of FIG. 4A shows the n-p side of the clamp in the "de-clamp" configuration, where the larger forward-bias current moves electrons into the 'n' region, as indicated by the arrows pointing upward, thereby causing the 'n' region to become less and less negatively charged and ultimately grounded, as shown in FIG. 4A. On the left side of the ESC 302 in FIG. 4A, the current density of the 'plus' charges is $10^3$-$10^4$ greater in the direction from the top of the ESC 302 towards the electrode 110 due to the nature of the p-n junction. Likewise, on the right side of the ESC 302, the current density of the 'minus' charges is $10^3$-$10^4$ greater in the direction from the electrode towards the top of the ESC 302 due to the nature of the n-p junction. The relatively lower impedance of the ESC 302 in the 'down' direction, compared to the 'up' direction, due to the nature of the p-n and n-p junctions allows the respective charges to drain out of the ESC 302 quickly so that the wafer 303 can be de-clamped in rapid fashion.

Figure 3C:
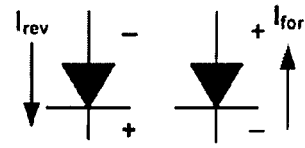
FIG. 3C is a circuit for the left side of the clamp 302 (FIGS. 3A and 4A) according to yet another aspect of the present invention.
Figure 4B:
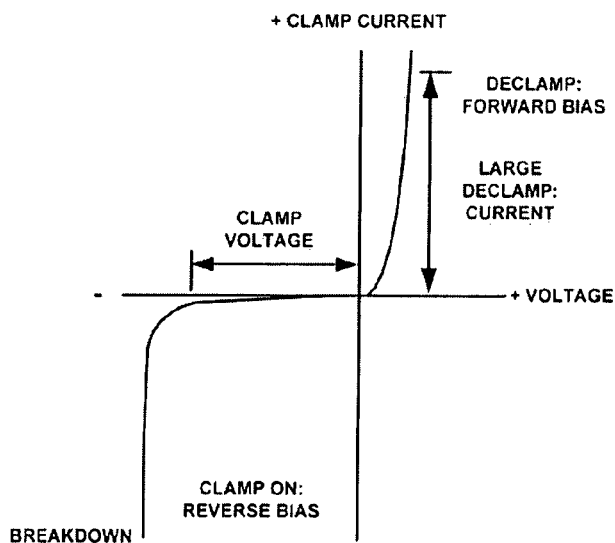
FIG. 4B is a graph of clamp voltage-current characteristics of the right side of the exemplary electrostatic clamp in FIG. 3A, according to yet another aspect of the present invention.

FIGS. 3B and 4B illustrate the characteristics of the left side and the right side of the ESC 302 shown in FIG. 3A, respectively. As discussed supra, FIG. 3B illustrates the ESC 302 in the "on" or clamping condition wherein the wafer 303 is held securely to the ESC 302. By applying a large positive voltage (e.g., greater than +800 volts) to the left side of the clamp 302, as illustrated in FIG. 3B, a large negative clamping current is created. In other words, the equivalent circuit for the left side of the clamp 302 is a zener diode circuit as illustrated in FIG. 3C.

Figure 4C:
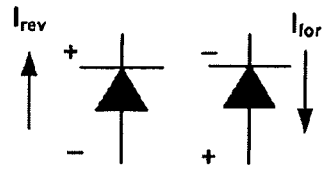
FIG. 4C is a circuit for the right side of the clamp 302 (FIGS. 3A and 4A) according to yet another aspect of the present invention.

As discussed supra, FIG. 3A illustrates the right hand side of the ESC 302 in the "on" or clamping condition wherein the wafer 303 is held securely to the ESC 302. By applying a negative voltage (e.g., less than −800 volts) to the right side of the clamp 302, as illustrated in FIG. 4B, a large negative clamping current is created. In other words, the equivalent circuit for the right side of the clamp 302 is a zener diode circuit as illustrated in FIG. 4C. Both FIGS. 3B and 4B illustrate that the voltage required to clamp the wafer is much higher than the voltage necessary to de-clamp the wafer and that once that voltage is applied a large clamping current is created.

Figure 5:
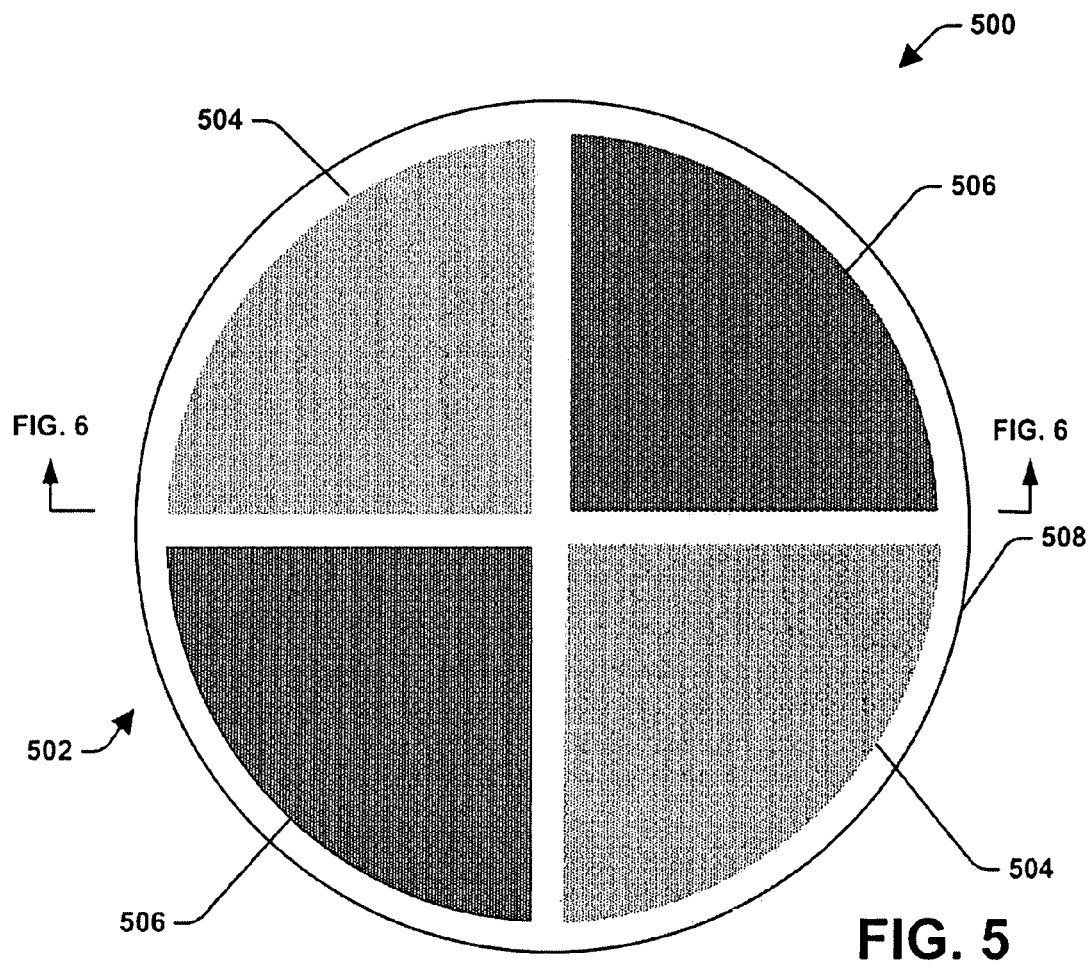
FIG. 5 is a top view of an exemplary multiple n-type and p-type wafer segments electrostatic clamp according to an aspect of the present invention.

FIG. 5 refers to yet another exemplary aspect of the present invention, utilizing four wafer segments, for example, for an electrostatic clamp 502 used in a clamping system 500. The upper left-hand segment, in the illustration, represents n-type wafer material 504. Traveling clockwise around FIG. 5, the wafer material alternates between n-type and p-type wafer material. Therefore, the wafer material in the upper right hand corner is p-type wafer material 506. The wafer segments are separated by an insulative layer 508. The insulative layer 508 can be silicone, insulative epoxy, glass, silicon dioxide, silicon oxide, and the like.

For example, the wafer segments, 514 and 516 can be charged and discharged at different times and at different rates, depending upon the specific application or process. By adjusting the charging and discharging rates, for example, the overall wafer processing time can be reduced for specific processes. For example, when the wafer is experiencing its greatest inertial forces, it may require that the wafer segments are charged to the maximum values, at the end of the process, under reduced inertial forces, a portion of the wafer segments can potentially be discharged prior to release because the process requires smaller clamping forces. It should be appreciated by one of ordinary skill in the art, that various segments and segment designs are possible, utilizing the p-type and n-type wafer. The wafers can be cut and/or sectioned utilizing photolithography, laser cutting, sawing, wire cutting and finishing, controlled fracture, laser induced fracturing, and the like.

According to another exemplary aspect of the present invention, the ESC 502 or a portion thereof, can serve as a replacement or replaceable component. For example, it may be desired, that the bipolar electrostatic clamp shown in FIG. 1 be replaced by the multi-segment electrostatic clamp shown in FIG. 5 and FIG. 6. Various configurations of electrostatic clamp heads, for example, could be connected using quick connect type features. Quick connect techniques are well known by those of ordinary skill in the art. Another aspect of the current invention is due to the low cost of the electrostatic clamp heads and therefore various clamping heads and configurations could be utilized for different processes, and at a much reduced cost. Due to the low cost of the electrostatic clamps and/or electrostatic clamp heads, the present need to fix a defective or damaged electrostatic clamp would be greatly reduced. The clamps could be replaced or thrown away, rather than carrying out timely and expensive repair processes.

Figure 6:
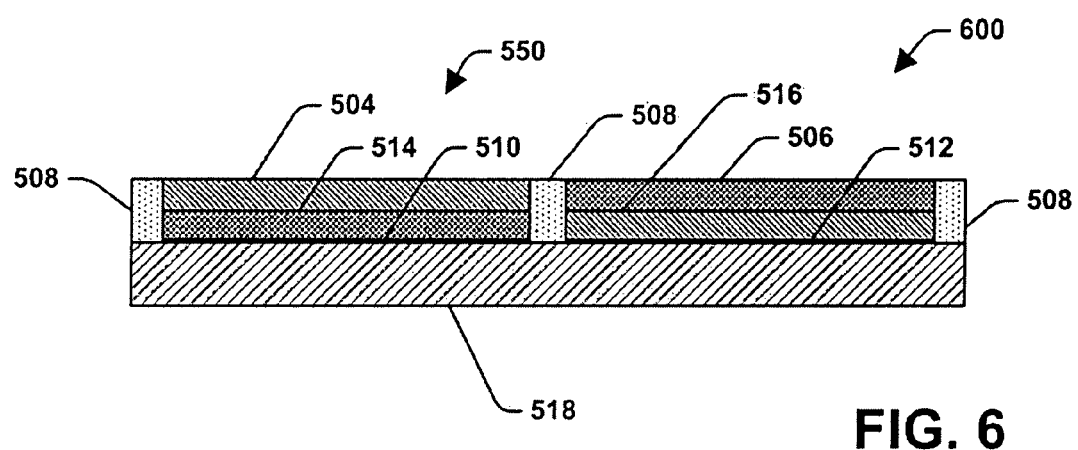
FIG. 6 is a side cross sectional view illustrating the exemplary multiple n-type and p-type wafer segments electrostatic clamp shown in FIG. 5, according to another aspect of the present invention.

FIG. 6 illustrates the cross-sectional side view of the electrostatic clamp shown in FIG. 5, taken through the middle portion of the clamp 502. FIG. 6 illustrates an exemplary electrostatic clamp 550, wherein the upper surface of the electrostatic clamp comprises an upper p-type region 504, an upper n-type region 506, a lower n-type wafer segment 514, a lower p-type wafer segment 516, an insulative layer(s) 508, electrodes 510 and 512, and a flat mounting plate 518. The mounting plate can comprise ceramic, a dielectric, a glass filled epoxy, and the like. The p-type region 504, for example, can be formed in the upper portion of the n-type wafer segment 514 and the n-type region 506 formed in the upper portion of the p-type wafer segment 516. The two doped wafer segments 514 and 516 together with the insulative layer 508 form a large diode which is operable to generally maintain a consistent strong electrostatic force with a wafer (not shown).

Figure 7:
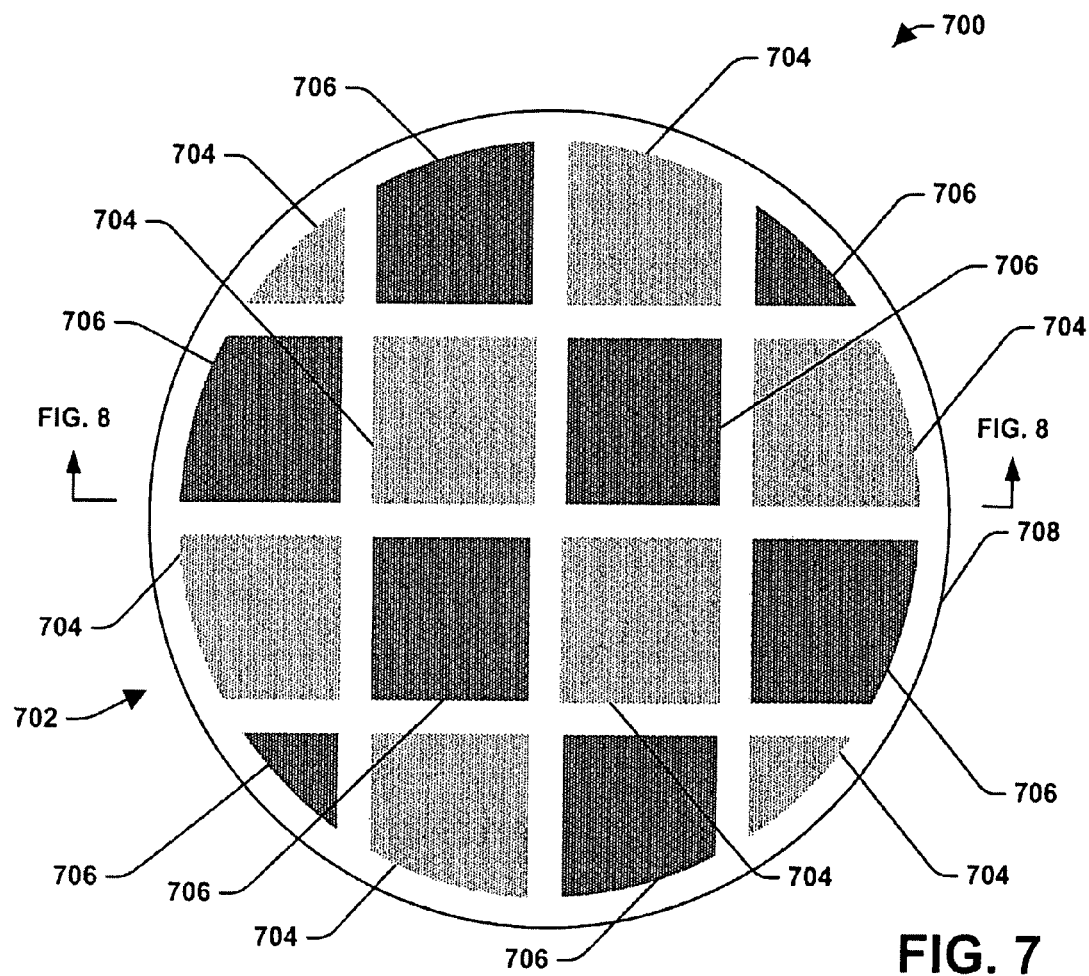
FIG. 7 is a top view of an exemplary multi-polar electrostatic clamp according to an aspect of the present invention.

A top view of another exemplary multi-polar electrostatic clamping system is shown in FIG. 7 at 700. According to one example, the electrostatic clamp 702 can be manufactured utilizing sixteen wafer segments, as illustrated. As discussed supra, the segments can be cut or segmented using various known techniques.

Figure 8:
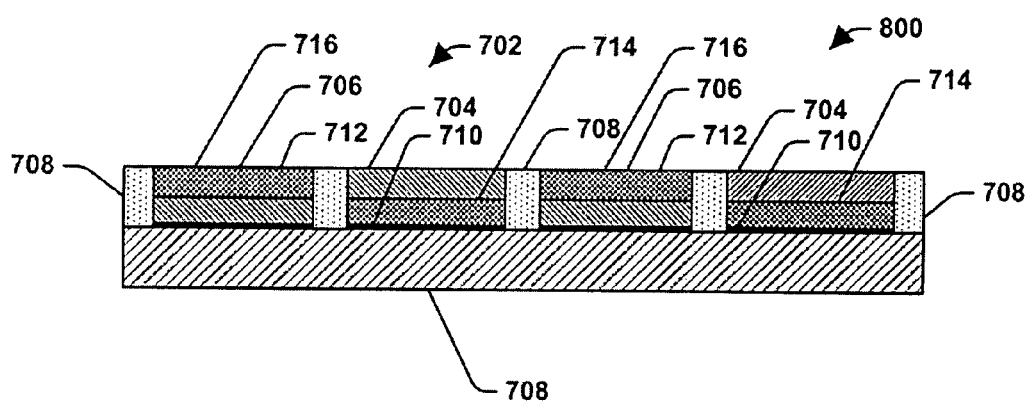
FIG. 8 is a cross sectional side view illustrating the exemplary multi-polar electrostatic clamp shown in FIG. 7, according to another aspect of the present invention.

It should be appreciated by those of ordinary skill in the art, that various wafer segment designs and configurations are possible. As can be seen in this example, the wafer segments on each row alternate between a p-type and an n-type wafer segment. In addition, the wafer segment above another wafer segment is the alternate type wafer material. Therefore, for example, the wafer segment in the first row, the second from the left end, is a p-type material (i.e., 704), for example. Referring to the third row, second from the left, the wafer segment is also a p-type material. However, various arrangements and configurations can be designing so that the clamping force is optimized for a given process, in order to improve the wafer throughput and clamping force. A side view of the electrostatic clamp, shown in FIG. 7, is illustrated in FIG. 8 at 800. It should be appreciated by one of ordinary skill in the art that the fabrication process can be carried out with doped-wafers, epitaxial deposition, and photolithographic techniques in order to build the electrostatic clamps.

FIG. 8 illustrates a cross section of the electrostatic clamp shown in FIG. 7, as seen through the center portion of the clamp 702, as shown. FIG. 8 illustrates an exemplary electrostatic clamp 702, wherein the upper surface of the electrostatic clamp comprises numerous upper p-type regions 704, numerous upper n-type regions 706, numerous lower n-type wafer segments 714, numerous lower p-type wafer segments 716, an insulative layer(s) 708, numerous electrodes 710 and 712, and a flat mounting plate 718. The mounting plate 718 can comprise ceramic, a dielectric, a glass filled epoxy, and the like. The p-type regions 704, for example, can be formed in the upper portion of the n-type wafer segments 714 and the n-type regions 706 can be formed in the upper portion of the p-type wafer segments 716. The doped wafer segments 714 and 716 together with the insulative layer 708 can form a large diode which is operable to generally maintain a consistently strong electrostatic force with a wafer (not shown).

Figure 9:
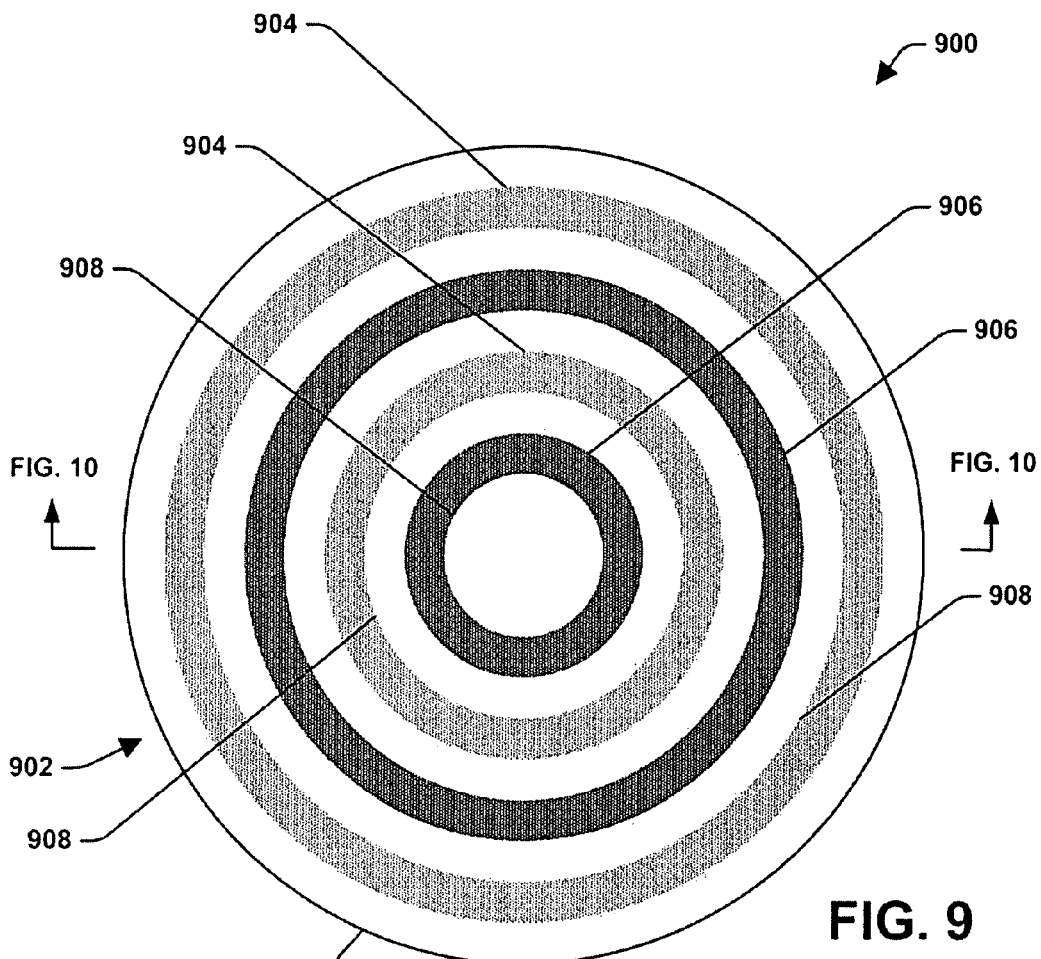
FIG. 9 is a top view of an exemplary multi-polar concentric ring electrostatic clamp according to an aspect of the present invention.

According to another example, an electrostatic clamp 902 is shown in FIG. 9, at 900, and comprises a series of concentric rings. The rings alternate between n-type and p-type wafer segments, 904 and 906, respectively, for example. The electronics necessary to electronically activate the electrodes and thereby discharge or charge the different wafer segments 914 and 916 respectively, are well known by those of ordinary skill in the art. In this example, the wafer is held by various circumferential forces acting at an equidistant location from the center of the electrostatic clamp. The more segments that are electronically activated at a given time, the greater the force exerted on the wafer and/or the greater the clamping force. As discussed supra, the wafer segments, 904 and 906, are doped in order to obtain the necessary bulk resistivity, for example. Various bulk resistivities can be chosen in order to obtain the desired clamping force. It should be apparent to one of ordinary skill in the art, that doping all the wafers is well-known, as well as adjusting the bulk resistivity of the wafer.

Figure 10:
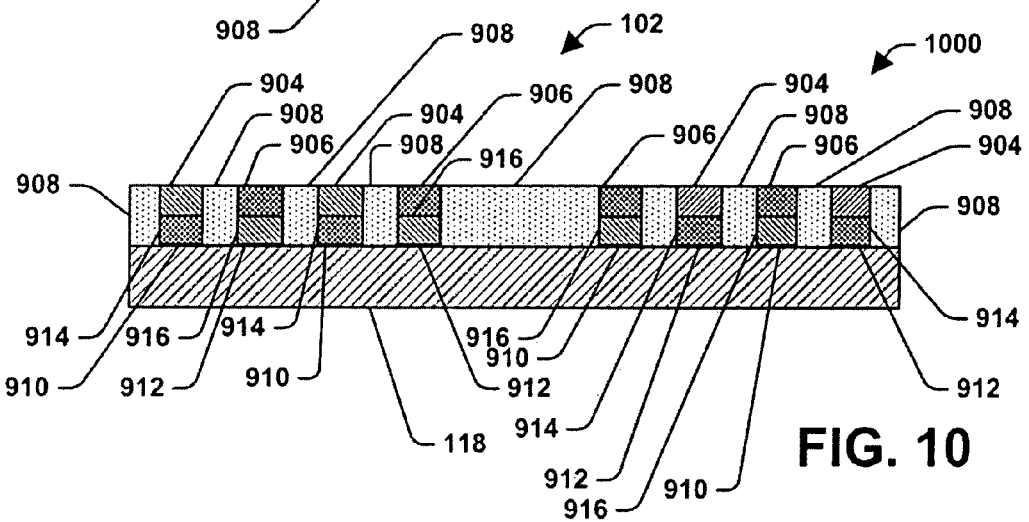
FIG. 10 is a cross sectional side view illustrating the exemplary multi-polar concentric ring electrostatic clamp shown in FIG. 9, according to another aspect of the present invention.

FIG. 10 illustrates a cross section of the electrostatic clamp shown in FIG. 9, through the middle portion of the clamp 902. FIG. 10 illustrates an exemplary electrostatic clamp 902, wherein the upper surface of the electrostatic clamp comprises numerous upper p-type regions 904, numerous upper n-type regions 906, numerous lower n-type wafer segments 914, numerous lower p-type wafer segments 916, an insulative layer(s) 908, numerous electrodes 910 and 912, and a flat mounting plate 918. The mounting plate 918 can comprise ceramic, a dielectric, a glass filled epoxy, and the like. The p-type regions 904, for example, can be are formed in the upper portion of the n-type wafer segments 914 and the n-type regions 906 can be formed in the upper portion of the p-type wafer segments 916. The doped wafer segments 914 and 916 together with the insulative layer 908 can form a large diode which is operable to generally maintain a consistent strong electrostatic force with a wafer (not shown).

Figure 11:
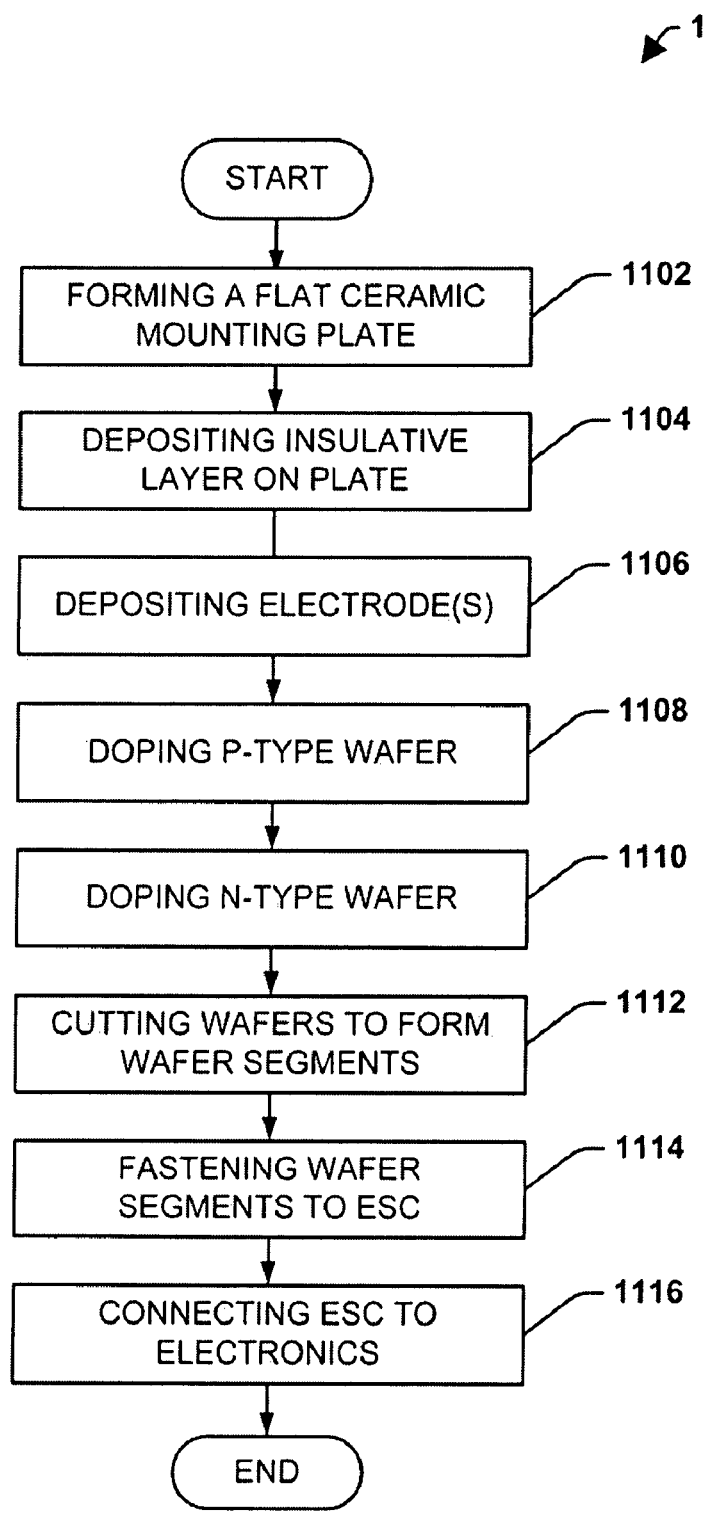
FIG. 11 illustrates an exemplary method for manufacturing and electrostatic clamp, according to another exemplary aspect of the present invention.

Referring now to FIG. 11, a method 1100 of manufacturing an electrostatic chuck is illustrated in accordance with one or more exemplary aspects of the present invention. Beginning with act 1102, a flat ceramic mounting plate is formed, based, at least in part, on the size of the wafer. In act 1104, an insulative layer is deposited on the flat ceramic mounting plate. The insulative layer, for example, may be deposited using CVD, vapor deposition, spin coating, and the like. In act 1106, the electrodes illustrated in FIGS. 3 and 4 are deposited. The electrodes, for example, can be deposited utilizing CVD (chemical vapor deposition), sputter deposition, plasma enhanced deposition, PVD (physical vapor deposition), low temperature plasma-assisted chemical vapor deposition, and the like. The electrode can be deposited to a thickness of about 25 to 200 um. In act 1108, the wafer is doped to obtain a p-type wafer. The doping of the wafer is performed in step 1110, to obtain an n-type wafer. The preferred materials to dope the silicon n-type are phosphorus (P) and arsenic (As), antimony (Sb), and the like. The preferred materials to dope the silicon p-type wafer comprise boron (B), aluminum (Al), gallium (Ga), indium (In), and the like.

At step 1112, in FIG. 11, the wafers are cut and/or sliced to form the necessary n-type and p-type wafer segments. For example, an n-type wafer would be cut to form a single wafer segment illustrated in FIG. 1. The wafer segments, are then fastened to the electrostatic clamp, in act or step 1114. As discussed supra, this can be accomplished utilizing glue, fasteners, mechanical grasping techniques, and the like. It is important, at this point, that the wafer segments are aligned in such a way that a form of flat planar surface. Although described herein are p-n diodes made using conventional (round) silicon wafers, alternatively diodes can be made out of semiconductors of any suitable shape or material. Alternate semiconductor materials can include germanium (Ge), gallium arsenide (GaAs), silicon carbide (SiC), zinc selenide (ZnSe), gallium phosphide (GaP), and the like. Alternate shapes comprise, triangular, square, rectangular, oval, and the like. At 1116, the various portions of the electrostatic clamp are connected electrically to power supplies, as is well known by those of ordinary skill in the art, wherein the method 1100 ends.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. An electrostatic clamp system, comprising:
   a first p-n junction semiconductor portion having a first p-type semiconductor segment overlying a first n-type semiconductor segment;
   a second p-n junction semiconductor portion laterally disposed and electrically isolated from the first p-n junction semiconductor portion, the second p-n junction semiconductor portion having a second n-type semiconductor segment overlying a second p-type semiconductor segment;
   a first conductive electrode underlying the first p-n junction semiconductor portion and electrically contacting the first n-type semiconductor segment; and
   a second conductive electrode underlying the second p-n junction semiconductor portion and electrically contacting the second p-type semiconductor segment,
   wherein the first and second conductive electrodes are electrically isolated from one another.

2. The electrostatic clamp system of claim 1, further comprising a power supply system configured to apply concurrently a first voltage to the first conductive electrode, and a second voltage to the second conductive electrode.

3. The electrostatic clamp system of claim 2, wherein the first voltage is different than the second voltage.

4. The electrostatic clamp system of claim 3, wherein in a clamp system ON configuration, the first voltage is a positive voltage, and the second voltage is a negative voltage.

5. The electrostatic clamp system of claim 2, wherein in a clamp system OFF configuration, the first and second voltages are the same voltage.

6. The electrostatic clamp system of claim 5, wherein the first and second voltages equal 0V.

7. The electrostatic clamp system of claim 2, wherein at least one of the first and second voltages applied by the power supply system comprises a time varying non-zero voltage value.

8. The electrostatic clamp system of claim 1, wherein:
   the first p-type semiconductor segment has a first surface facing the first n-type semiconductor segment, and a second, opposing surface forming a first clamp face portion configured to support a workpiece thereon; and
   the second n-type semiconductor segment has a first surface facing the second p-type semiconductor segment, and a second, opposing surface forming a second clamp face portion configured to support the workpiece thereon.

9. The electrostatic clamp system of claim 8, wherein the first and second clamp face portions are each unitary portions.

10. The electrostatic clamp system of claim 8, wherein the first and second clamp face portions are each not unitary portions.

11. The electrostatic clamp system of claim 10, wherein the first and second clamp face portions that are not unitary portions collectively form a checkerboard type pattern.

12. The electrostatic clamp system of claim 10, wherein the first and second clamp face portions that are not unitary portions collectively form a pattern of alternating concentric rings.

13. The electrostatic clamp system of claim 1, further comprising a dielectric support substrate upon which the first and second conductive electrodes reside.

* * * * *